United States Patent
Seo (10) Patent No.: US 7,804,874 B2
(45) Date of Patent: Sep. 28, 2010

(54) MULTIBEAM LASER APPARATUS AND IMAGE FORMING DEVICE USING THE SAME

(75) Inventor: Woon-ho Seo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 256 days.

(21) Appl. No.: 11/683,536

(22) Filed: Mar. 8, 2007

(65) Prior Publication Data

US 2008/0063021 A1 Mar. 13, 2008

(30) Foreign Application Priority Data

Sep. 12, 2006 (KR) .............. 10-2006-0088170

(51) Int. Cl.
*H01S 5/00* (2006.01)

(52) U.S. Cl. .............. 372/50.12; 372/50.121; 372/50.122; 372/50.123; 372/50.124

(58) Field of Classification Search .. 372/50.12–50.124
See application file for complete search history.

(56) References Cited

U.S. PATENT DOCUMENTS 4,901,330 A * 2/1990 Wolfram et al. .............. 372/75

| | | | | |
|---|---|---|---|---|
| 5,073,806 A | * | 12/1991 | Idei | 257/96 |
| 5,465,263 A | * | 11/1995 | Bour et al. | 372/23 |
| 5,881,085 A | * | 3/1999 | Jewell | 372/46.013 |
| 7,072,372 B2 | * | 7/2006 | Ohki et al. | 372/45.01 |
| 2004/0105471 A1 | * | 6/2004 | Kneissl et al. | 372/36 |
| 2006/0192209 A1 | | 8/2006 | Maeda et al. | |

FOREIGN PATENT DOCUMENTS

EP 0437836 7/1991

OTHER PUBLICATIONS

European Search Report dated Feb. 1, 2008 issued in EP 07111312.0.

* cited by examiner

*Primary Examiner*—Tod T Van Roy
(74) *Attorney, Agent, or Firm*—Stanzione & Kim, LLP

(57) ABSTRACT

A multibeam laser apparatus and an image forming device using the same. The multibeam laser beam apparatus includes a common electrode unit, a plurality of light source units to emit light using the common electrode unit, and an isolating unit to interconnect the common electrode unit and the plurality of light source units. With such configuration for example, the laser apparatus can reduce distances between the respective light source units and the number of the electrodes, and thus reduce the number of wires and legs to produce a compact chip.

25 Claims, 5 Drawing Sheets

MULTIBEAM LASER APPARATUS AND IMAGE FORMING DEVICE USING THE SAME

CROSS-REFERENCE TO RELATED APPLICATIONS

This application claims priority under 35 U.S.C. §119(a) of Korean Patent Application No. 10-2006-0088170, filed Sep. 12, 2006, in the Korean Intellectual Property Office, the disclosure of which is incorporated herein by reference in its entirety.

BACKGROUND OF THE INVENTION

1. Field of the Invention

The present general inventive concept relates generally to a multibeam laser apparatus and an image forming device using the same. More particularly, the present general inventive concept relates to a multibeam laser apparatus in which a common electrode is used and a dopant density of an isolating unit and varying depths of grooves are formed according to a distance from the common electrode and an image forming device to use the same.

2. Description of the Related Art

Generally, in a printer, a printing speed is decreased as resolution is increased. Accordingly, to improve the printing speed, there is a need for a high resolution printer which may use a short wavelength light source to produce a multibeam laser.

A short wavelength nitride laser apparatus, as a light source of laser printer, can produce a dot size smaller and a depth of focus better than those of a conventional infrared (IR) or red diode laser apparatus.

A multibeam nitride laser apparatus produces a multibeam laser by using an insulator substrate of sapphire ($Al_2O_3$) or the like, or a conductive substrate of GaN or the like.

In general, in the case of using the insulator substrate, a laser apparatus is configured, so that an N-type GaN layer, an N-type AlGaN clad layer, an N-type GaN optical waveguide layer, a multi-quantum well (MQW) active layer, a P-type InGaN intermediate layer, a P-type AlGaN cap layer, a P-type GaN optical waveguide layer, a P-type AlGaN clad layer and a P-type GaN contact layer are layered in sequence, and P-electrodes on the P-type GaN contact layer are connected with N-electrodes of an exposed portion of the N-type GaN layer.

Conversely, in the case of using the conductive substrate, a laser apparatus is configured, so that N-electrodes are formed on a lower end of the substrate.

Accordingly, if the multibeam is produced using the insulator substrate, the P-electrodes and the N-electrodes are located on an upper end surface of the same substrate. In this case, it is important to properly connect the inside two P-electrodes to outside electrode pads and to properly connect the N-electrodes.

Figure 1:
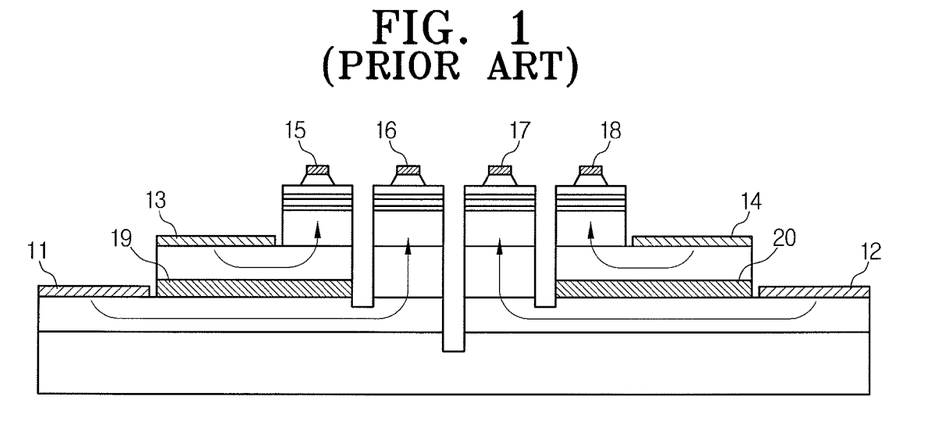
FIGS. 1 through 3 are views exemplifying constructions of conventional multibeam nitride laser apparatuses, respectively.
Figure 2:
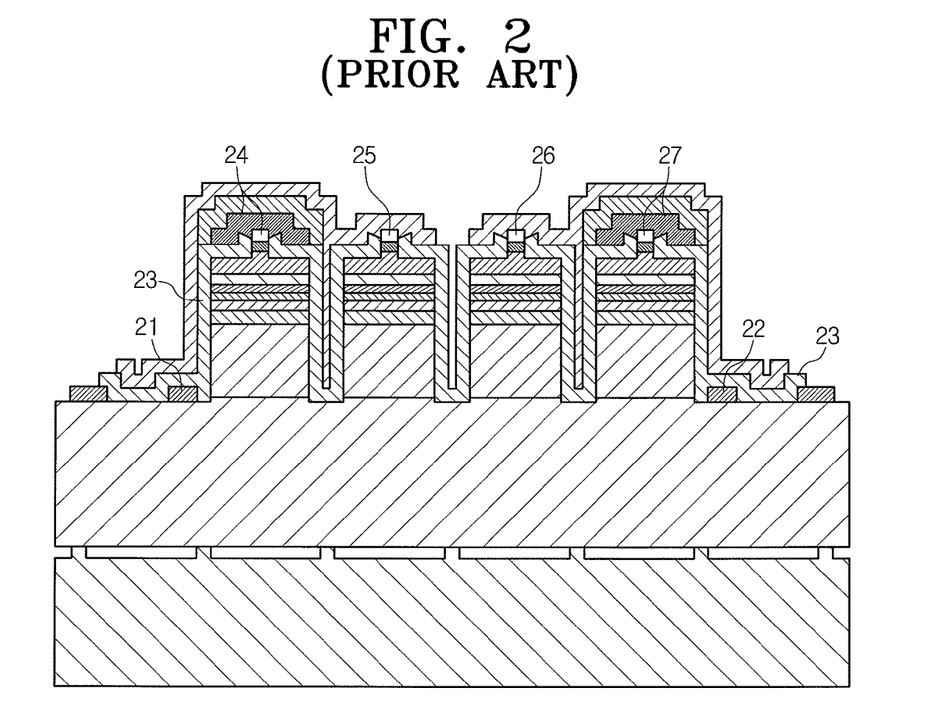
Figure 3:
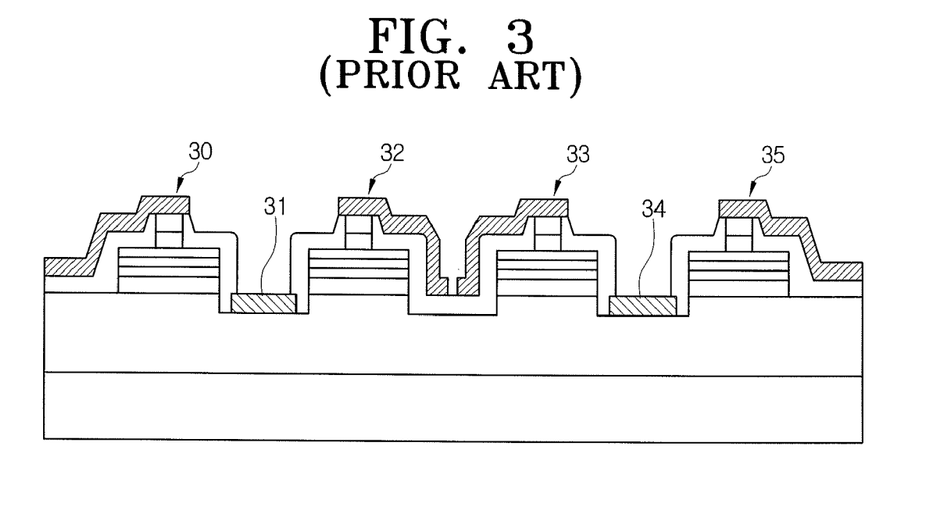

FIGS. 1 through 3 are views illustrating constructions of conventional multibeam nitride laser apparatuses, respectively.

Referring to FIG. 1, a conventional multibeam nitride laser apparatus is configured in a structure such that four N-electrodes 11, 12, 13, and 14 and four P-electrodes 15, 16, 17 and 18 are formed to control four channels, respectively. The four channels are referred to as Nos. 1, 2, 3 and 4 from the left. To electrically isolate the channel Nos. 1-2 (channel No. 1: arrow in FIG. 1 from 13 to 15; channel No. 2: arrow in FIG. 1 from 11 to 16) and the channel Nos. 3-4 (channel No. 3: arrow in FIG. 1 from 12 to 17; channel No. 4: arrow in FIG. 1 from 14 to 18) from each other, respectively, insulating layers 19 and 20 are additionally formed on the N-type GaN layer in channel No. 1 and channel No. 4, as illustrated. Thus, an electric current flows along a path represented by the arrows illustrated in FIG. 1.

Referring to FIG. 2, another conventional multibeam nitride laser apparatus is configured in a structure such that two N-electrodes 21 and 22 are formed at both sides of four P-electrodes 24, 25, 26 and 27 to allow the left N-electrode 21 to control channel Nos. 1-2 (channel No. 1: from the bottom of 21 toward 24; channel No. 2: from the bottom of 21 toward 25) and to allow the right N-electrode 22 to control channel Nos. 3-4 (channel No. 3: from the bottom of 22 towards 26; channel No. 4: from the bottom of 22 towards 27). That is, each of the N-electrodes controls two P-electrodes. To connect the inside channel Nos. 2 and 3 to the outside N-electrodes 21 and 22, the channel Nos. 2 and 3 and the channel Nos. 1 and 4 are formed with the insulating layer 23 interposed therebetween, as illustrated in FIG. 2.

Referring to FIG. 3, another conventional multibeam nitride laser apparatus is configured in a structure such that a first N-electrode 31 is formed between P-electrodes 30 and 32 of channel Nos. 1-2 (channel No. 1: from 31 towards 30; channel No. 2: from 31 towards 32) and a second N-electrode 34 is formed between P-electrodes 33 and 35 of channel Nos. 3-4 (channel No. 3: from 34 towards 33; channel No. 4: from 34 towards 35) to allow each of the first and the second N-electrodes to control the two P-electrodes. In this case, a path length of electric current is shorter than that of the multibeam nitride laser apparatus of FIG. 1.

The conventional multibeam nitride laser apparatuses as described above have some disadvantages as follows.

In case of the multibeam nitride laser apparatus of FIG. 1, since there is no N-electrode between the respective channels, it can reduce distances between adjacent laser diodes. However, the multibeam nitride laser apparatus requires an additional process, which forms the two N-type GaN layers and selectively forms the insulating layers (19 and 20) therebetween. Also, since the four N-electrodes corresponding to the respective channels are formed, wires for controlling them are increased in number.

In case of the multibeam nitride laser apparatus of FIG. 2, the insulating layer 23, which electrically isolates channel No. 1 from channel No. 2 or electrically isolates channel No. 3 from channel No. 4, is formed having the same height at the respective channels. Accordingly, crosstalk may occur between channel Nos. 1 and 2 and between channel Nos. 3 and 4, respectively.

In case of the multibeam nitride laser apparatus of FIG. 3, the N-electrodes are formed in common between channel Nos. 1 and 2 and between channel Nos. 3 and 4, respectively. Accordingly, distances between the channels become narrowed. As a result, a problem may occur, in that it is difficult to form the laser diode structure having such channels.

SUMMARY OF THE INVENTION

The present general inventive concept provides a multibeam laser apparatus in which a common electrode is used and a dopant density of an isolating unit and varying depths of grooves (G) are formed according to a distance from the common electrode, thereby to reduce distances between respective light source units and the number of electrodes, and thus to reduce the number of wires and legs to produce a compact chip, and an image forming device to use the multibeam laser apparatus.

Additional aspects and advantages of the present general inventive concept will be set forth in part in the description which follows and, in part, will be obvious from the description, or may be learned by practice of the general inventive concept.

The foregoing and/or other aspect and utilities of the present general inventive concept may be achieved by providing a multibeam laser apparatus including a common electrode unit, a plurality of light source units to emit light using the common electrode unit, and an isolating unit to interconnect the common electrode unit and the plurality of light source units.

The isolating unit may include a semiconductor substrate in which a predetermined dopant is doped, and a doping density of the dopant may be increased according to a distance from the common electrode unit.

Also, the apparatus may further include at least one groove to isolate the plurality of light source units from each other to prevent an interference between the plurality of light source units.

The at least one groove may be connected from at least one position between upper side surfaces of the plurality of light source units to a position within the isolating unit.

A depth of the at least one groove may be increased according to a distance from the common electrode unit.

Each of the plurality of light source units may include a first semiconductor layer formed on an upper side surface of the isolating unit, an active layer formed on the first semiconductor layer, a second semiconductor layer formed on the active layer, and at least one electrode layer formed on the second semiconductor layer to be connected to a power source having an opposite polarity to a polarity of the common electrode unit.

The first semiconductor layer and the isolating unit may be formed of an N-type semiconductor, and the second semiconductor layer may be formed of a P-type semiconductor.

Alternatively, the first semiconductor layer and the isolating unit may be formed of a P-type semiconductor, and the second semiconductor layer may be formed of an N-type semiconductor.

At least one of the first and the second semiconductor layers may be a nitride semiconductor layer.

Also, the apparatus may further include an insulator substrate to come in contact with a lower side surface of the isolating unit.

According to another exemplary embodiment of the present general inventive concept, the common electrode unit may include a first common electrode formed on an area of an upper side surface of the isolating unit, and a second common electrode formed on an area spaced apart from the first common electrode in the upper side surface of the isolating unit.

Further, the plurality of light source units may include a first light source unit located between the first and the second common electrodes to use the first common electrode, and a second light source unit located between the first and the second common electrodes to use the second common electrode.

Also, the apparatus may further include a groove to isolate the first and the second light source units from each other to prevent an interference between the first and the second light source unit.

The groove may be connected from a position between upper side surfaces of the light source units to a position on the inside of the isolating unit.

According to another exemplary embodiment of the present general inventive concept, at least one of the common electrode unit and the plurality of light source units may be formed in a right angle pattern on the upper side surface of the isolating unit.

Also, the active layer, the second semiconductor layer and the electrode layer of each of the plurality of light source units may have at least one notch formed in a predetermined shape in the same position.

Alternatively, each of the first and the second common electrode may be formed in the shape of a bar on the upper side surface of the isolating unit, and each of the first and the second light source units is formed in a right angle pattern on the upper side surface of the isolating unit.

According to other exemplary embodiments of the present general inventive concept, there is provided an image forming device to use the multibeam laser apparatus as described herein.

The foregoing and/or other aspect and utilities of the present general inventive concept may be achieved by providing a multibeam laser apparatus including a common electrode unit, a plurality of light source units to emit light driven by the common electrode, an isolating unit to interconnect the common electrode unit and the plurality of light source units, where the solating unit is doped with a dopant having an increasing density along a lateral distance in a direction away from the common electrode to correspond to the respective light source units.

The foregoing and/or other aspect and utilities of the present general inventive concept may be achieved by providing a multibeam laser apparatus including a common electrode unit, a plurality of light source units to emit light driven by the common electrode, a substrate having a surface, an isolating unit on the surface of the substrate, the isolating unit to interconnect the common electrode unit and the plurality of light source units, where the plurality of light source units are isolated by one or more grooves extending into the isolating unit, and where one or more notches are formed in at least one of the light source units and in the isolating unit to permit deposition of a high reflective dielectric coating on the surface of the substrate.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 4:
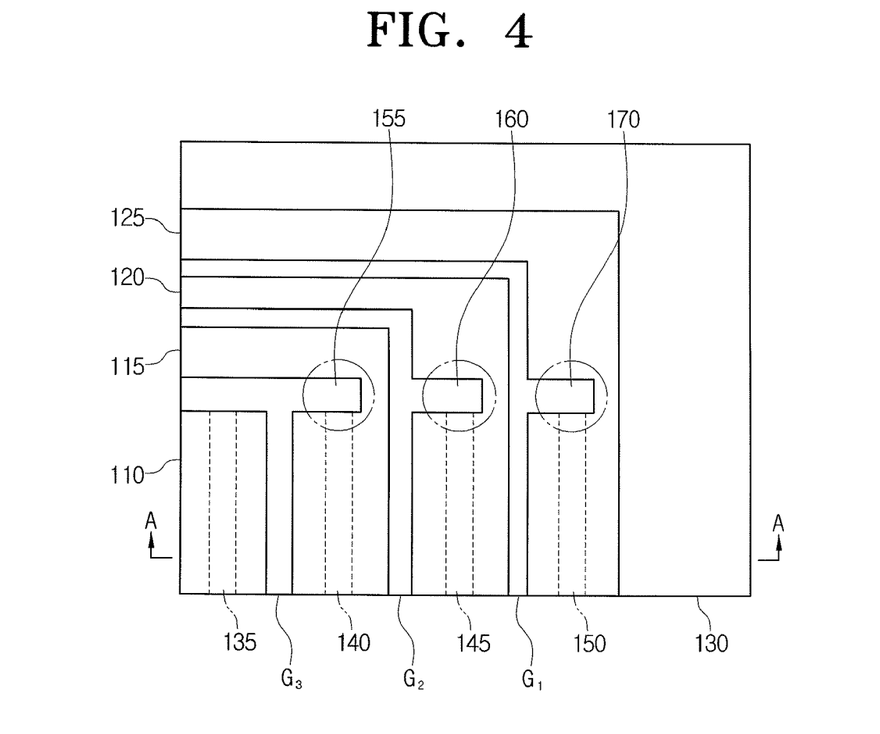
FIGS. 4 and 5 are views exemplifying a multibeam laser apparatus according to an exemplary embodiment of the present general inventive concept.
Figure 5:
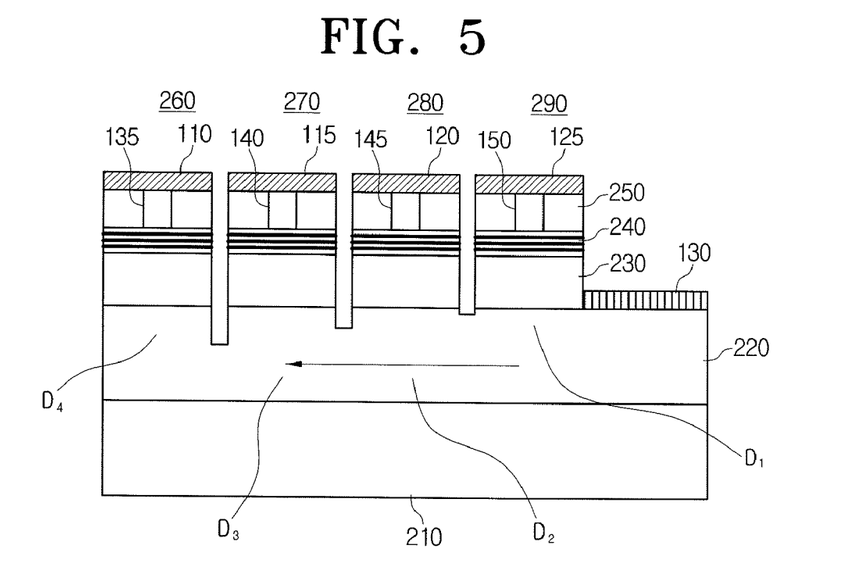

FIGS. 4 and 5 are views exemplifying a multibeam laser apparatus according to an exemplary embodiment of the present general inventive concept. The multibeam laser apparatus according to an exemplary embodiment of the present general inventive concept may include a common electrode unit 130, a plurality of light source units 260, 270, 280 and 290 to emit light using the common electrode unit 130, and an isolating unit 220 to prevent an interference between the plurality of light source units 260, 270, 280 and 290.

That is, the multibeam laser apparatus according to the exemplary embodiment of the present general inventive concept may be configured so that the plurality of light source units 260, 270, 280 and 290 can use the common electrode unit 130 and can emit light when an electric power is applied to each unit by the common electrode unit 130.

FIG. 4 is a top plan view of the multibeam laser apparatus according to the exemplary embodiment of the present general inventive concept, and FIG. 5 is a cross sectional view of the multibeam laser apparatus taken along line A-A of FIG. 4. The multibeam laser apparatus according to an exemplary embodiment of the present general inventive concept may be a refractive index waveguide semiconductor laser having a ridge structure and a separate confinement heterostructure (SCH) structure.

Referring to FIGS. 4 and 5, the multibeam laser apparatus has the isolating unit 220, which may be grown and layered on an insulator substrate 210 by using a lateral crystal growth technique, such as an epitaxial lateral overgrowth (ELO), for example. Other suitable layering methods may be used.

The isolating unit 220 may be a semiconductor substrate in which a predetermined dopant is doped. That is, the isolating unit 220 may be an N-type nitride semiconductor layer in which an N-type dopant, for example, silicon (Si), is doped as the predetermined dopant. In the description of the present general inventive concept, the N-type nitride semiconductor refers to a semiconductor of group III-V nitride, such as GaN, AlN, InN, etc.

Figure 7:
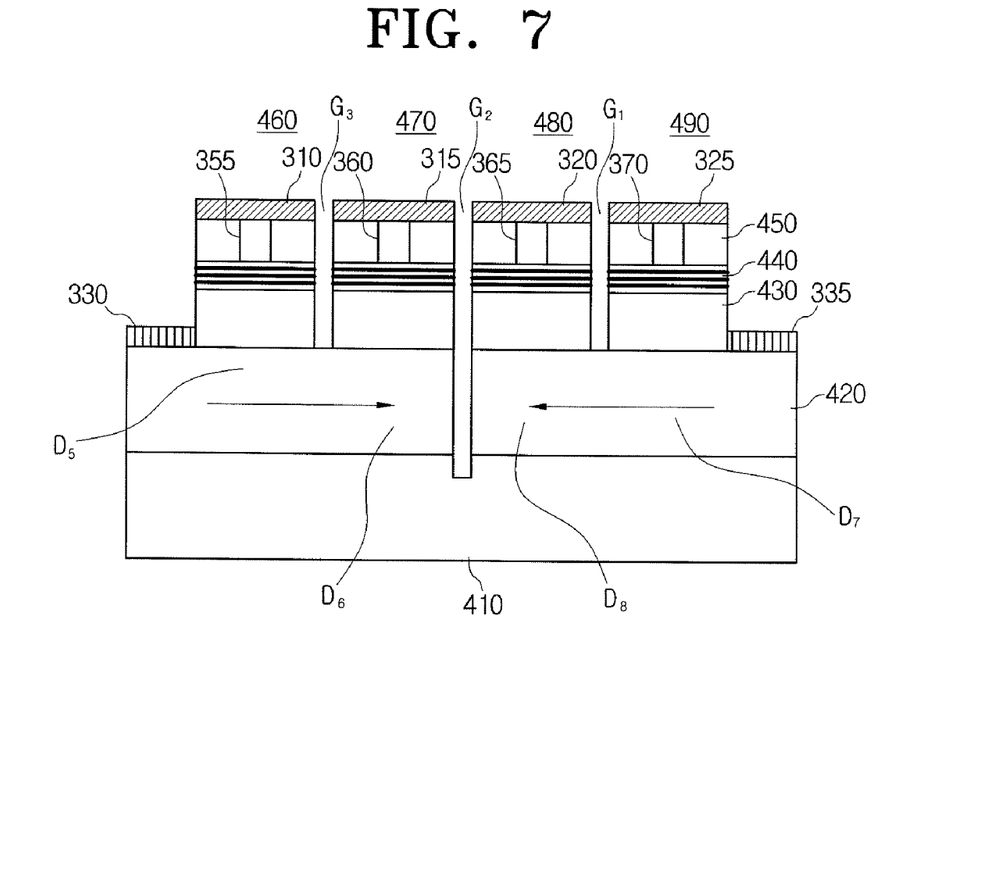

The doping method may be a graded lateral doping method. Accordingly, the dopant can be doped, so that as the distance from the common electrode unit 130 is increased, the density of the dopant is also increased. Thus, an electric current can more smoothly flow to the plurality of light source unit 260, 270, 280 and 290. For example, as illustrated in FIG. 5, dopant density D1 is greater than D2, D3, and D4. The D1, D2, D3, and D4 dopant densities are gradually increased from D1 to D2 to D3 to D4 according to the distance from the common electrode 130. Also, for example, as illustrated in FIG. 7, the dopant density D6 is greater than D5, according to the distance from common electrode 330 and the dopant density D8 is greater than D7, according to the distanced from common electrode 335.

The plurality of light source units 260, 270, 280 and 290 layered on the isolating unit 220 can be formed in a shape such that 4 mesas are disposed adjacent to one another, as illustrated in FIG. 5, for example. The light source units 260, 270, 280 and 290 may be separated from one another by at least one groove, for example, 3 grooves (G).

Here, the grooves G (G1, G2, and G3) can be formed to extend from positions between upper side surfaces of the light source units 260, 270, 280 and 290 to positions of the interior of the isolating unit 220, respectively, so as to separate the light source units 260, 270, 280 and 290 from one another, respectively, as illustrated in FIG. 5, for example.

Also, the grooves (G) can be formed so that depths thereof are increased (or varied) according to the distance from the common electrode unit 130. That is, for example, the greater the distance from the common electrode unit 130, the greater the depth thereof. Thus, the groove (G) farthest from the common electrode 130 may have the greatest depth in relation to another groove closer to common electrode 130.

With this configuration, crosstalk occurable among the light source units 260, 270, 280 and 290 can be reduced, minimized or prevented. Here, the crosstalk refers to an interference phenomenon of light such that light emitted from, for example, one light source unit 290 is detected at an adjacent light source unit 280. In the case of crosstalk, an undesirable interference pattern may form between light from adjacent light sources.

Each of the plurality of light source units 260, 270, 280 and 290 includes a first semiconductor layer 230 formed on the isolating unit 220, an active layer 240, a second semiconductor layer 250, and electrode layers 110, 115, 120, and 125 connected to a power source (not illustrated) to have an opposite polarity to a polarity of the common electrode unit 130.

Here, the first semiconductor layer 230 and the isolating unit 220 can be formed of an N-type semiconductor, and the second semiconductor layer 250 can be formed of a P-type semiconductor. Alternatively, the first semiconductor layer 230 and the isolating unit 220 may be formed of a P-type semiconductor, and the second semiconductor layer 250 may be formed of an N-type semiconductor.

To be more specific, each of the plurality of light source units 260, 270, 280 and 290 can be configured so that an N-type AlGaN clad layer and an N-type GaN optical waveguide layer form an N-type nitride semiconductor layer as the first semiconductor layer 230; an active layer 240 of (In, Ga)N:GaN multi-quantum well (MQW) structure; a P-type InGaN intermediate layer, a P-type AlGaN cap layer, a P-type GaN optical waveguide layer, a P-type AlGaN clad layer and a P-type GaN contact layer form a P-type nitride semiconductor layer as the second semiconductor layer 250; and P type-electrode layers 110, 115, 120 and 125 are layered thereon in turn, for example, as illustrated in FIG. 5.

Here, the second semiconductor layer 250 not only acts to prevent 'In' from being broken away from the active layer 240 and deteriorated, but also to prevent (or to reduce or to minimize) overflow of electrons from the active layer 240.

At least one of the common electrode unit 130 and the plurality of light source units 260, 270, 280 and 290 can be formed in a right angle pattern on the upper side surface of the isolating unit 220, respectively, as illustrated in FIG. 4, for example.

On the other hand, the common electrode unit 130 layered on one side of the upper side surface of the isolating unit 220 can be formed of a metal. The plurality of light source units 260, 270, 280 and 290 can be connected to the common electrode unit 130, and can emit light when an electric power is applied thereto. Thus, the multibeam laser apparatus can reduce the number of separate electrodes and thus the number of wires and legs in a chip needed to emit laser light from a multibeam laser apparatus.

Ridges 135, 140, 145, and 150 can be formed in the plurality of light source units 260, 270, 280 and 290, respectively. That is, the ridges 135, 140, 145, and 150 can radiate light emitted from the active layer 240. The ridges can be located at low defect areas between electric charges propagated to the upper layers from seed crystals that may be grown using a lateral growth method as described below.

Notches 155, 160 and 170 can be formed in a predetermined shape at the same position as the position of the active layer 240, the second semiconductor layer 250, and the electrode layers 110, 115, 120, and 125 of each of the plurality of light source units 260, 270, 280 and 290, respectively, so as to provide a space for deposition of a high reflective dielectric coating. That is, when a dielectric may be coated on a surface of the substrate, the notches 155, 160 and 170 can penetrate to a depth to indirectly absorb and reflect light of specified wavelength.

Hereinafter, a fabrication method of the multibeam laser apparatus according to the exemplary embodiment of the present general inventive concept will be described. At first, by using a metal organic chemical vapor deposition (MOCVD) method, an isolating unit 220 is grown on an insulator substrate 210, a surface of which is planarized by a thermal cleansing method or the like.

Here, the isolating unit 220 refers to a nitride semiconductor layer formed using a lateral crystal growth technique, for example. A doping method of an N-type dopant can use a graded lateral doping method. In other words, the concentration or density of the dopant (e.g., N-type or other suitable dopant) may be gradually increased as the lateral distance (along the isolating unit 220) from the common electrode 130 is increased, for example. Other gradual changes in the dopant concentration or density may be provided as the lateral distance (along the isolating unit 220) from the common electrode 130 is increased. For example, the concentration or density of the dopant (e.g., N-type dopant or P-type dopant) may gradually (or stepwise) increase (or gradually vary or gradually decrease, if so desired) as the lateral distance (along the isolating unit 220) from the common electrode 30 is increased.

On the isolating unit 220, a plurality of light source units 260, 270, 280, and 290 can be formed. The light source units can include an N-type nitride semiconductor layer 230 that can be formed by the MOCVD method on the isolating unit 220. To be more specific, an N-type nitride semiconductor layer 230, an active layer 240 of MQW structure, and a P-type nitride semiconductor layer 250 can be grown in turn on the isolating unit 220. Also, as illustrated in FIGS. 4 and 5, P-type electrodes 110, 115, 120, and 125 can be formed on the second semiconductor layer 250

In the growth of the nitride type semiconductor layers 230 or 250 (or both), materials of Ga, Al, In, and N, such as trimethylgallium (TMG), trimethyl aluminum (TMA), trimethyl indium (TMI), and $NH_3$ can be used, respectively. As an N-type dopant and a P-type dopant, Si and Mg can be used, respectively.

Next, ridges 135, 140, 145, and 150 can be formed by selectively etching the nitride type semiconductor layers down to a depth of the P-type nitride semiconductor layer 250 by a reactive ion etching (RIE) method, for example, as illustrated in FIG. 5.

After that, the nitride type semiconductor layers can be etched to form the grooves (G) using the P-type electrode layers as a mask up to a portion of the isolating unit 220 by an RIE method until the desired depth is obtained, for example. As a result, the light source units 260, 270, 280, and 290 can be formed in such a shape so that 4 mesas can be disposed adjacent to one another and at the same time, grooves (G) can be formed to divide the light source units 260, 270, 280, and 290 from one another, as illustrated in FIG. 5, for example. At this time, the grooves (G) can be formed so that their corresponding depths can be increased in proportion to a distance from the common electrode unit 130 to be described in further detail below, also as illustrated in FIG. 5, for example.

The common electrode unit 130 can be formed on one side of the isolating unit 220 by the RIE method as described above. Here, for example, the common electrode unit 130 can have an N-polarity, and can be used as a common electrode for the plurality of light source units 260, 270, 280, and 290, with the layers having the appropriate polarities sufficient to emit the desired multibeam laser light.

According to this, the number of electrodes can be reduced with the use of the common electrode unit 130, and the crosstalk occurable among the respective light source units 260, 270, 280, and 290 can be reduced, minimized or prevented with the varying dopant densities of the isolating unit 220 and the varying depths of the grooves (G) formed to be different according to the distance from the common electrode unit 130.

Figure 6:
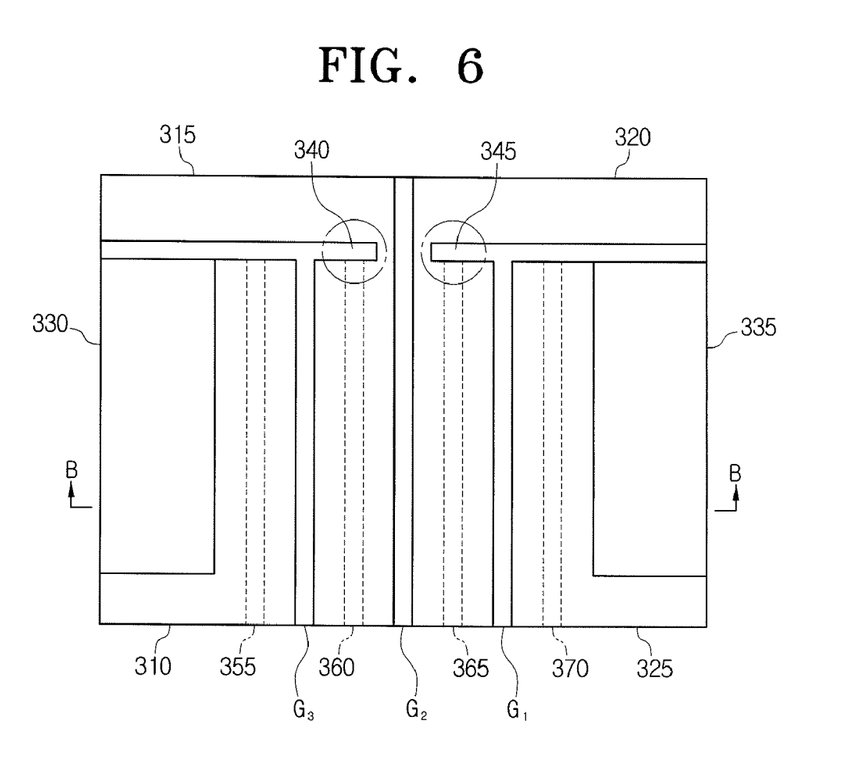
FIGS. 6 and 7 are views exemplifying a multibeam laser apparatus according to another exemplary embodiment of the present general inventive concept.

FIGS. 6 and 7 are views exemplifying a multibeam laser apparatus according to another exemplary embodiment of the present general inventive concept.

FIG. 6 is a top plan view of a multibeam laser apparatus, and FIG. 7 is a cross-sectional view of the multibeam laser apparatus taken along line B-B of FIG. 6.

Referring to FIGS. 6 and 7, the multibeam laser apparatus includes a first common electrode 330 formed on a portion area of an upper side surface of an isolating unit 420, a second common electrode 335 formed on a portion of the upper side surface of the isolating unit 420 spaced apart from the first common electrode 330, and a first light source unit 460 and 470 and a second light source unit 480 and 490 located between the first and the second common electrodes. The material elements (and/or density or concentrations) used in forming the various layers illustrated in FIGS. 6 and 7 are the same as those of the corresponding multibeam laser apparatus explained with reference to FIGS. 3 and 4. Thus, a detailed description thereof will be for brevity. However, the description of the materials used and their concentrations or densities with respect to the embodiments of FIGS. 4 and 5 may be applied to the embodiments of FIGS. 6 and 7—with the exception that the density or concentration of the dopant in insulating unit 420 can be gradually increased toward the illustrated central groove of FIGS. 6 and 7, for example.

In the multibeam laser apparatus according to another exemplary embodiment of the present general inventive concept, a central groove (G), which divides the first light source unit 460 and 470 and the second light source unit 480 and 490 from each other, can be formed to have a depth extending from a position between adjacent upper surfaces of the first and the second light source units down to a position of the interior of an insulator substrate 410. Accordingly, the groove can reduce an interference between the first light source unit 460 and 470 and the second light source unit 480 and 490.

Also, the first light source unit 460 and 470 can be connected with and driven by the first common electrode 330 formed on a portion area of the upper side surface of the isolating unit 420. Further, the isolating unit 420 can be formed so that as the lateral distance from the first common electrode 330 is increased, the dopant density thereof is also increased. With this configuration, an electric current can smoothly flow from the common electrode 330 toward the P-electrodes 310 and 315.

In the same manner, the second light source unit 480 and 490 can be connected with and driven by the second common electrode 335 formed on a portion area of the upper side surface of the isolating unit 420. Further, the isolating unit 420 can be formed so that as the lateral distance from the second common electrode 335 is increased, the dopant density thereof is also increased. With this configuration, an electric current can smoothly flow from the common electrode 335 toward the P-electrodes 320 and 325.

Ridges 355, 360, 365 and 370 can be formed in light sources 460, 470, 480 and 490 of the first and the second light source units, respectively. That is, the ridges 355, 360, 365 and 370, which radiate light emitted from an active layer 440, can be located at low defect areas between electric charges propagated to upper layers from seed crystals that can be grown using a lateral growth technique.

Also, notches 340 and 345 can be formed to provide a space to permit deposition of a high reflective dielectric coating. That is, when a dielectric is coated on a surface of the substrate, the notches 340 and 345 can penetrate to a depth sufficient to indirectly absorb and reflect light of specified wavelength.

The first and second light source units 460, 470, 480 and 490 can be formed in a right angle pattern on the upper side surface of the isolating unit 420, respectively, as illustrated in FIGS. 6 and 7, for example.

In exemplary embodiments, the multibeam laser apparatus may include grooves G1 and G3 which extend to varying depths into the isolating unit 420 to isolate the first and second light source units 460, 470, 480, and 490. The multibeam laser apparatus may also include a first common electrode 330 formed on an area of an upper surface of the isolating unit 420 and a second common electrode 335 formed on another area of the upper surface of the isolating unit 420.

Figure 8:
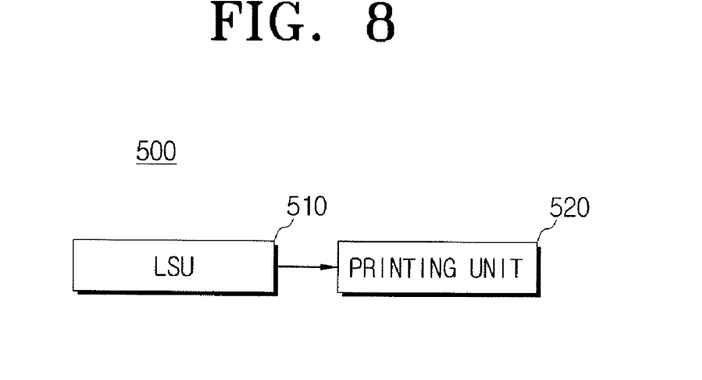
FIGS. 8 and 9 are views exemplifying an image forming device to use the multibeam laser apparatus according to exemplary embodiments of the present general inventive concept.
Figure 9:
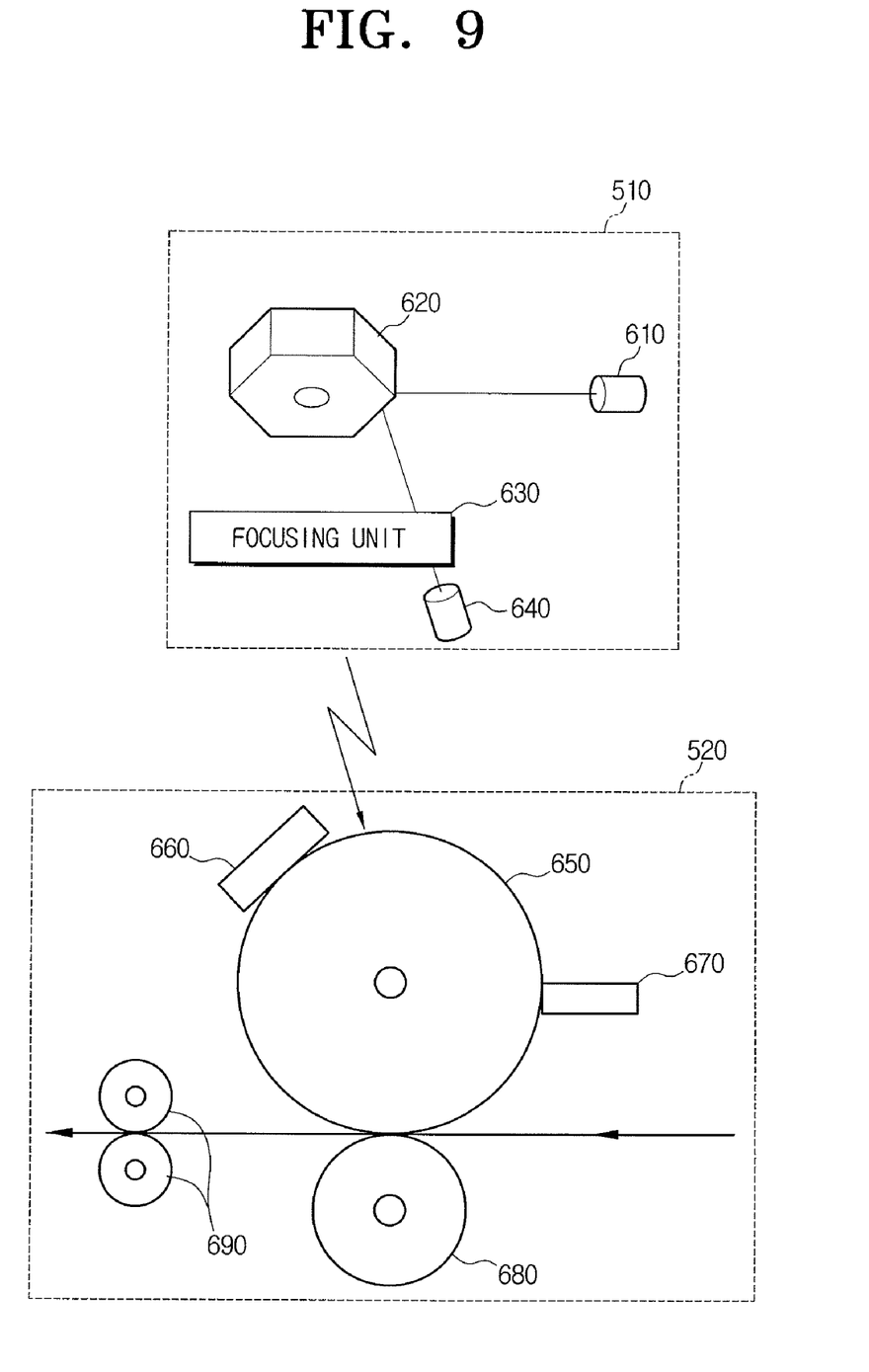

FIGS. 8 and 9 are views exemplifying an image forming device using the multibeam laser apparatus according to exemplary embodiments of the present general inventive concept.

Referring to FIG. 8, the image forming device 500 using the multibeam laser apparatus can include a laser scanning unit (LSU) 510 and a printing unit 520.

The LSU 510 can emit and can scan a plurality of light beams on a surface of a photoconductive drum and thus can form an electrostatic latent image corresponding to an image to be printed on the surface of the photoconductive drum.

Also, the LSU 510 can include a multibeam laser apparatus. The multibeam laser apparatus can be formed so that a plurality of light sources are divided by at least one groove (G) (e.g., 2 or more grooves, 3 or more grooves, etc.), and as the lateral distance from a common electrode unit is increased, the dopant density of an isolating unit is increased. Also, as the lateral distance from a common electrode is increased, the depth of the grooves (G) is increased. Since such a multibeam laser apparatus can be the same as the multibeam laser apparatus of the exemplary embodiments explained with reference to FIGS. 4 through 7, a detailed description thereof will be omitted for brevity.

The printing unit 520 can execute a series of image forming process operations which can include a charge operation, an exposure operation, a development operation, a transfer operation, a fixing operating and a discharge operation as needed to develop the electrostatic latent image formed on the photoconductive drum by the LSU 510 into a developer image and to transfer and to fix the developer image on a printing paper (or other suitable medium) to form a desired image.

Referring to FIG. 9, a construction of the image forming device of FIG. 8 is illustrated in further detail pursuant to an embodiment of the present general inventive concept. The image forming device can include the LSU 510 and the printing unit 520. The LSU 510 can be provided with a multibeam laser apparatus 610 having the same structure as that of the multibeam laser apparatus of the exemplary embodiments explained with reference to FIGS. 4 through 7, a polygon mirror 620, a focusing unit 630, and a light receiving unit 640. The printing unit 520 can be provided with a photoconductive drum 650, a charging unit 660, a developing unit 670, a transferring roller 680, and a fixing unit 690.

Light emitted from the multibeam laser apparatus 610 of the LSU 510 can arrive as parallel beams of or as a convergent beam of light which are/is parallel to a main scanning direction and a sub-scanning direction while passing through a lens unit (not illustrated).

After passing through the lens unit (not illustrated), the light becomes incident on the polygon mirror 620. And then, the incident light can be reflected in a predetermined angle by the polygon mirror 620, which can be rotated at a high speed, and can be emitted toward the focusing unit 630.

The focusing unit 630 can include a scanning system lens, which can be made of a toric lens and a focusing lens. The focusing unit 630 can focus and can scan the incident light onto the photoconductive drum 650 of the printing unit 520. The photoconductive drum 650 has a surface area that is of an effective scanning width section (not illustrated) on which an electrostatic latent image can be formed by the scanned light from the focusing unit 630. The LSU 510 can be equipped with the light receiving unit 640 to detect a horizontal synchronizing signal $H_{13}$sync for regularly synchronizing the effective scanning width section of the photoconductive drum 650 with that of the light from the focusing unit 630.

Here, the horizontal synchronizing signal $H_{13}$sync is a signal produced by the laser scanning unit 510 used to form the electrostatic latent image on the photoconductive drum 650.

The printing unit 520 can form an image on a printing paper (or other suitable medium) at a high speed. For this, the printing unit 520 can be provided with a charging unit 660 to charge (and/or discharge as needed) the photoconductive drum 650 with a predetermined electric charge to form (or erase) an electrostatic latent image, a developing unit 670 to develop the electrostatic latent image formed on the photoconductive drum 650 by the LSU 510 as described above with a developer, a transferring roller 680 to transfer the developed image onto the printing paper (or other suitable medium) while rotating in engagement with the photoconductive drum 650, and a fixing unit 690 to fuse (or fix) the image transferred on the printing paper (or other suitable medium) with heat and/or pressure.

The image forming device constructed as described above can use the multibeam laser apparatus so that it can improve the printing speed and/or resolution.

As apparent from the foregoing description, according to the exemplary embodiments of the present general inventive concept, the multibeam laser apparatus and the image forming device to use the same utilize a the common electrode. Accordingly, the multibeam laser apparatus according to the exemplary embodiments of the present general inventive concept and the image forming device to use the same can reduce the distances between the respective light source units and the number of electrodes, and thus reduce the number of wires and legs to produce a more compact chip.

Further, the multibeam laser apparatus according to the exemplary embodiments of the present general inventive concept and the image forming device to use the same can be configured so that the dopant density of the isolating unit and the depths of the grooves (G) are formed to be different according to the distance from the common electrode. Accordingly, the crosstalk among the light source units can be reduced, minimized or prevented.

Also, the image forming device according to the exemplary embodiments of the present general inventive concept can use the multibeam laser apparatus so that it can improve the printing speed and the printing resolution. An image forming apparatus (or device) may include any one of the above-noted the multibeam laser apparatuses described herein.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A multibeam laser apparatus, comprising:
   a common electrode unit;
   a plurality of light source units using the common electrode unit to emit light; and
   an isolating unit to interconnect the common electrode unit and the plurality of light source units,
   wherein the plurality of light source units are isolated by at least two grooves of varying depth extending into the isolating unit, and
   wherein the isolating unit comprises a semiconductor substrate in which a predetermined dopant is doped, and a doping density of the dopant is increased according to a distance from the common electrode unit.

2. The apparatus of claim 1, wherein the at least two grooves prevent an interference between the plurality of light source units.

3. The apparatus of claim 2, wherein the at least two grooves extend into the isolating unit from at least one position between upper side surfaces of the plurality of light source units.

4. The apparatus of claim 3, wherein the depth of the at least two grooves is increased according to a corresponding distance of the grooves from the common electrode unit.

5. The apparatus of claim 1, wherein
   the at least two grooves prevent an interference between the plurality of light source units.

6. The apparatus of claim 5, wherein the at least two grooves extend into the isolating unit from at least one position between upper side surfaces of the plurality of light source units.

7. The apparatus of claim 6, wherein the depth of the at least two grooves is increased according to a corresponding distance of the grooves from the common electrode unit.

8. The apparatus of claim 1, wherein each of the plurality of light source units comprises:
   a first semiconductor layer formed on an upper surface of the isolating unit;
   an active layer formed on the first semiconductor layer;
   a second semiconductor layer formed on the active layer; and
   at least one electrode layer formed on the second semiconductor layer to be connected to a power source having an opposite polarity relative to a polarity of the common electrode unit.

9. The apparatus of claim 8, wherein the first semiconductor layer and the isolating unit are formed of an N-type semiconductor, and the second semiconductor layer is formed of a P-type semiconductor.

10. The apparatus of claim 8, wherein the first semiconductor layer and the isolating unit are formed of a P-type semiconductor, and the second semiconductor layer is formed of an N-type semiconductor.

11. The apparatus of claim 8, wherein at least one of the first and the second semiconductor layers comprises a nitride semiconductor layer.

12. The apparatus of claim 8, wherein at least one of the common electrode unit and the plurality of light source units is formed in a right angle pattern on the upper surface of the isolating unit, respectively.

13. The apparatus of claim 12, wherein:
   the active layer, the second semiconductor layer and the electrode layer of each of the plurality of light source units has at least one corresponding notch formed in a predetermined shape at the same corresponding position.

14. The apparatus of claim 1, further comprising:
   an insulator substrate to come in contact with a lower surface of the isolating unit.

15. The apparatus of claim 14, wherein the common electrode unit comprises:
   a first common electrode formed on a portion area of an upper surface of the isolating unit; and
   a second common electrode formed on another portion of an upper surface of the isolating unit spaced apart from the first common electrode.

16. The apparatus of claim 15, the plurality of light source units comprises:
   a first light source unit located between the first and the second common electrodes and driven by the first common electrode;
   a second light source unit located between the first and the second common electrodes and driven by the second common electrode; and
   a third light source unit located between the first and second common electrodes and driven by either the first common electrode or the second common electrode.

17. The apparatus of claim 16, wherein the at least two grooves prevent an interference between adjacent ones of the first, the second and the third light source units.

18. The apparatus of claim 16, wherein each of the first and the second common electrodes is formed in the shape of a bar on the upper surface of the isolating unit, and each of the first, the second, and the third light source units is formed in a right angle pattern on the upper surface of the isolating unit.

19. The apparatus of claim 17, wherein the at least two grooves extend into the isolating unit from a position between upper surfaces of the light source units.

20. An image forming device to use a multibeam laser apparatus, the multibeam laser apparatus comprising:
   a common electrode unit;
   a plurality of light source units to emit light using the common electrode; and
   an isolating unit to interconnect the common electrode unit and the plurality of light
   source units according to a varying doping density, and to prevent an interference between the plurality of light source units according to at least two grooves of varying depth,
   wherein the isolating unit comprises a semiconductor substrate in which a predetermined dopant is doped, and a doping density of the dopant is increased according to a distance from the common electrode unit.

21. A multibeam laser apparatus, comprising:
   a common electrode unit;

a plurality of light source units to emit light driven by the common electrode;

an isolating unit to interconnect the common electrode unit and the plurality of light source units, wherein the isolating unit comprises a semiconductor substrate which is doped with a dopant having an increasing doping density along a lateral distance in a direction away from the common electrode unit to correspond to the respective light source units.

22. A multibeam laser apparatus, comprising:
a common electrode unit;
a plurality of light source units to emit light driven by the common electrode;
a substrate having a surface;
an isolating unit on the surface of the substrate, the isolating unit to interconnect the common electrode unit and the plurality of light source units;
wherein the plurality of light source units are isolated by one or more grooves extending into the isolating unit,
wherein one or more notches are formed in at least one of the light source units and in the isolating unit to permit deposition of a high reflective dielectric coating on the surface of the substrate, and
wherein the isolating unit comprises a semiconductor substrate in which a predetermined dopant is doped, and a doping density of the dopant is increased according to a distance from the common electrode unit.

23. A multibeam laser apparatus, comprising:
at least one common electrode unit;
a plurality of light source units using the at least one common electrode unit to emit light;
an isolating unit to interconnect the at least one common electrode unit and the plurality of light source units; and
an insulator substrate to come in contact with a lower surface of the isolating unit,
wherein the plurality of light source units are isolated by at least two grooves of varying depth extending at least to the isolating unit and the isolating unit comprises a semiconductor substrate which is doped with a dopant having an increasing doping density along a lateral distance in a direction away from the at least one common electrode unit to correspond to the respective light source units.

24. A multibeam laser apparatus, comprising:
a common electrode unit;
a plurality of light source units using the common electrode unit to emit light; and
a single isolating unit to interconnect the common electrode unit and at least two adjacent light source units of the plurality of light source units,
wherein the plurality of light source units are isolated by at least two grooves of varying depth extending toward the isolating unit, and
wherein the isolating unit comprises a semiconductor substrate in which a predetermined dopant is doped, and a doping density of the dopant is increased according to a distance from the common electrode unit.

25. An isolating unit of a multibeam laser apparatus having a common electrode and a plurality of light source units, the isolating unit comprising:
a dopant doped substrate; and
a plurality of connectors to interconnect the common electrode unit and the plurality of light source units and to prevent an interference between the plurality of light source units according to at least two grooves of varying depth,
wherein a doping density of the dopant increases as a distance from the common electrode unit increases.

* * * * *